United States Patent
Hachisuga et al.

(10) Patent No.: US 11,417,677 B2
(45) Date of Patent: Aug. 16, 2022

(54) SEMICONDUCTOR MEMORY DEVICE

(71) Applicant: Kioxia Corporation, Tokyo (JP)

(72) Inventors: Ayaha Hachisuga, Yokkaichi (JP); Daigo Ichinose, Nagoya (JP)

(73) Assignee: Kioxia Corporation, Tokyo (JP)

( * ) Notice: Subject to any disclaimer, the term of this patent is extended or adjusted under 35 U.S.C. 154(b) by 155 days.

(21) Appl. No.: 17/014,733

(22) Filed: Sep. 8, 2020

(65) Prior Publication Data

US 2021/0288060 A1 Sep. 16, 2021

(30) Foreign Application Priority Data

Mar. 12, 2020 (JP) .............................. JP2020-043421

(51) Int. Cl.
*H01L 27/11578* (2017.01)
*H01L 27/11582* (2017.01)
*H01L 27/11573* (2017.01)

(52) U.S. Cl.
CPC .. *H01L 27/11573* (2013.01); *H01L 27/11578* (2013.01)

(58) Field of Classification Search
CPC ........ H01L 27/11573; H01L 27/11578; H01L 27/11582
See application file for complete search history.

(56) References Cited

U.S. PATENT DOCUMENTS

| | | | | |
|---|---|---|---|---|
| 9,853,052 B1* | 12/2017 | Setta | ................ | H01L 27/11556 |
| 9,871,054 B2* | 1/2018 | Imamura | .......... | H01L 27/11565 |
| 10,916,557 B2* | 2/2021 | Takeshita | .......... | H01L 27/11575 |
| 2015/0084204 A1* | 3/2015 | Yun | .................... | H01L 27/11519 |
| | | | | 438/618 |
| 2015/0179660 A1* | 6/2015 | Yada | ................. | H01L 27/11556 |
| | | | | 257/314 |
| 2015/0340376 A1* | 11/2015 | Park | .................. | H01L 27/11575 |
| | | | | 257/329 |
| 2015/0380418 A1 | 12/2015 | Zhang et al. | | |
| 2016/0049422 A1* | 2/2016 | Kim | .................. | H01L 27/11565 |
| | | | | 257/329 |
| 2017/0033044 A1* | 2/2017 | Choi | ................. | H01L 21/76877 |
| 2017/0084624 A1* | 3/2017 | Lee | ...................... | H01L 23/5283 |
| 2017/0200733 A1* | 7/2017 | Lee | ................... | H01L 21/76816 |
| 2017/0213846 A1* | 7/2017 | Lee | ...................... | H01L 29/7827 |
| 2017/0221813 A1* | 8/2017 | Kim | .................. | H01L 27/11582 |
| 2017/0263624 A1* | 9/2017 | Aoyama | .......... | H01L 27/11565 |
| 2017/0263626 A1* | 9/2017 | Okamoto | .......... | H01L 27/11582 |

(Continued)

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

According to one embodiment, a semiconductor memory device includes a first conductive layer, and a first structure that extends in a first direction orthogonal to a stacking direction of a stacked body and the stacking direction, and reaches a position deeper than an upper surface of the first conductive layer. The first structure has a first width at a bottom of the stacked body, and a second width narrower than the first width, in a first depth region from a position of the upper surface of the first conductive layer to a first depth position. A third conductive layer is connected to a side surface of the first conductive layer in the first depth region in a second direction orthogonal to the stacking direction and the first direction.

20 Claims, 10 Drawing Sheets

(56) References Cited

U.S. PATENT DOCUMENTS

| | | | |
|---|---|---|---|
| 2017/0271345 A1* | 9/2017 | Shimura | G11C 16/14 |
| 2017/0271362 A1* | 9/2017 | Sonehara | H01L 23/5283 |
| 2017/0271365 A1* | 9/2017 | Fujii | H01L 27/1157 |
| 2018/0350831 A1* | 12/2018 | Kim | H01L 27/1157 |
| 2019/0006383 A1* | 1/2019 | Matsuno | H01L 21/76816 |
| 2019/0074189 A1* | 3/2019 | Park | H01L 27/11582 |
| 2020/0194453 A1* | 6/2020 | Lim | H01L 27/11575 |
| 2020/0402997 A1* | 12/2020 | Ahn | H01L 27/1157 |
| 2021/0335801 A1* | 10/2021 | Yang | H01L 21/76877 |

* cited by examiner

SEMICONDUCTOR MEMORY DEVICE

CROSS-REFERENCE TO RELATED APPLICATIONS

This application is based upon and claims the benefit of priority from Japanese Patent Application No. 2020-043421, filed on Mar. 12, 2020; the entire contents of which are incorporated herein by reference.

FIELD

Embodiments described herein relate generally to a semiconductor memory device.

BACKGROUND

In a three-dimensional nonvolatile memory, a source line may be arranged below a stacked body in which a plurality of memory cells is arranged three-dimensionally, and a source line contact penetrating the stacked body may be connected to the source line. In such a structure, how to reliably connect the source line and the source line contact is a challenge.

DETAILED DESCRIPTION

A semiconductor memory device according to an embodiment includes: a first conductive layer, a stacked body that is arranged above the first conductive layer and includes a plurality of second conductive layers stacked with a first insulating layer interposed therebetween; a pillar that extends in the stacked body in a stacking direction of the stacked body, reaches a first position in the first conductive layer, the first position being deeper than a position of an upper surface of the first conductive layer, and includes a plurality of memory cells at intersections with at least some of the plurality of second conductive layers; and a first structure that extends in the stacked body in a first direction orthogonal to the stacking direction and in the stacking direction, and reaches a second position in the first conductive layer, the second position being deeper than the position of the upper surface of the first conductive layer. The first structure has a width in a second direction orthogonal to the stacking direction and the first direction, the width including a first width at a bottom of the stacked body and a second width that is narrower than the first width, in a first depth region from the position of the upper surface of the first conductive layer to a first depth position that is deeper than the position of the upper surface in the first conductive layer, and the first structure includes a third conductive layer that extends in the first structure in the first direction and the stacking direction and is connected to a side surface of the first conductive layer in the second direction in the first depth region.

The present invention will be explained below in detail with reference to the accompanying drawings. Note that the present invention is not limited to the following embodiment. In addition, constituent elements in the following embodiment include something that can be easily assumed by those skilled in the art or that is substantially the same.

Configuration Example of Semiconductor Memory Device

Figure 1:
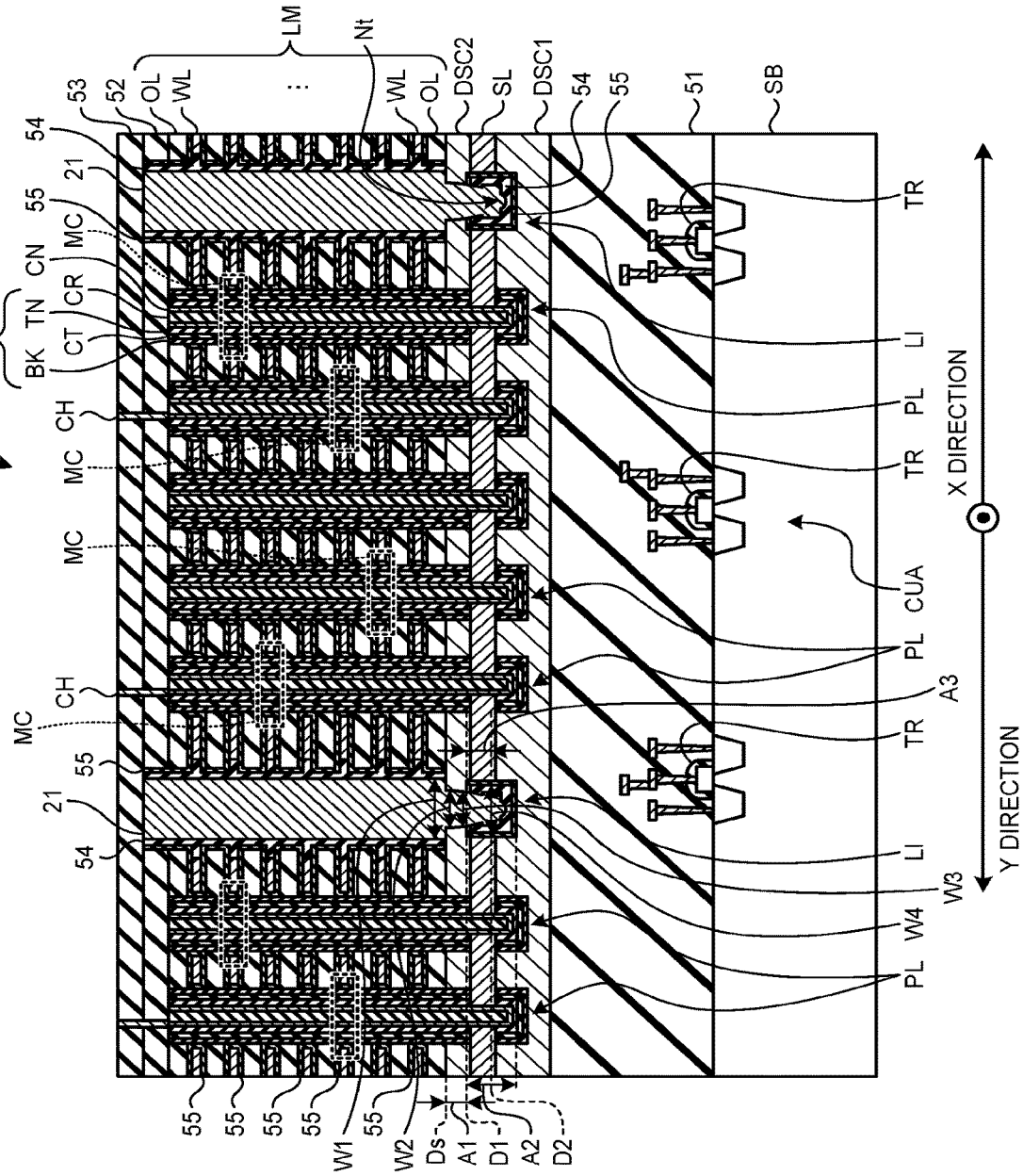
FIG. 1 is a cross-sectional view illustrating a configuration example of a semiconductor memory device according to an embodiment.

FIG. 1 is a cross-sectional view illustrating a configuration example of a semiconductor memory device 1 according to the embodiment. As illustrated in FIG. 1, the semiconductor memory device 1 includes a peripheral circuit CUA, a source line SL, a memory unit MR, and a plurality of contacts LI on a substrate SB. Note that, in the present specification, in the drawings, the open end sides of the contacts LI and pillars PL extending in a stacked body LM are the upper side of the semiconductor memory device 1, and the closed end sides are the lower side of the semiconductor memory device 1.

The substrate SB is, for example, a semiconductor substrate such as a silicon substrate. The peripheral circuit CUA including a transistor TR is arranged on the surface of the substrate SB. The peripheral circuit CUA contributes to the operation of a memory cell MC described later. The peripheral circuit CUA is covered with an insulating layer 51 such as a $SiO_2$ layer.

On the insulating layer 51, a conductive layer DSC1, the source line SL, and a conductive layer DSC2 are arranged in order from the side close to the substrate SB. The conductive layer DSC1, the source line SL, and the conductive layer DSC2 are all polysilicon layers or the like. The doping amount and the like in the polysilicon layer may be different for each layer. Since these layers are in contact with each other, any of these layers may function as a buried source line. The conductive layer DSC1, the source line SL, and the conductive layer DSC2 functioning as a buried source line are examples of the first conductive layer.

On the conductive layer DSC2, the stacked body LM is arranged, in which a plurality of word lines WL serving as second conductive layers and insulating layers OL serving as first insulating layers are alternately stacked. However, block layers 55 are arranged on the upper and lower surfaces of the word lines WL. The word line WL is, for example, a tungsten layer or a molybdenum layer. The insulating layer OL is, for example, a $SiO_2$ layer. The block layer 55 is, for example, an $Al_2O_3$ layer or the like.

Note that, in the example of FIG. 1, the stacked body LM has seven layers of word lines WL, but the number of layers of word lines WL is arbitrary. Further, the stacked body LM may be configured by arranging a select gate line (not illustrated) below the lowermost word line WL, and may be configured by arranging a select gate line (not illustrated) above the uppermost word line WL.

A plurality of pillars PL is arranged in a matrix on the stacked body LM. Each pillar PL has an open end on the upper surface of the stacked body LM, and has a memory layer ME, a channel layer CN, and a core layer CR as constituent materials, those are arranged in a memory hole having a closed end at a predetermined depth of the conductive layer DSC1. That is, the pillar PL penetrates the stacked body LM, the conductive layer DSC2, and the source line SL, and reaches a predetermined depth of the conductive layer DSC1.

More specifically, the pillar PL has the memory layer ME arranged on the outermost periphery and bottom surface, the channel layer CN arranged inside the memory layer ME, and the core layer CR arranged inside the channel layer CN. The memory layer ME is a layer in which a block insulating layer BK, a charge storage layer CT, and a tunnel insulating layer TN are stacked in order from the outermost peripheral side and the bottom surface side of the pillar PL. The block insulating layer BK, the tunnel insulating layer TN, and the core layer CR are, for example, $SiO_2$ layers. The charge storage layer CT is, for example, a SiN layer or the like. The channel layer CN is a semiconductor layer such as an amorphous silicon layer or a polysilicon layer.

However, the pillar PL does not have the memory layer ME at the depth position of the source line SL. As a result, the channel layer CN exposed on the outer peripheral surface of the pillar PL is connected to the source line SL. Note that the depth position where the pillar PL is connected to the source line SL on the outer peripheral surface is included in a depth region A3 as a third depth region from a depth position D1 as a first depth position to a depth position D2 as a second depth position, which will be described later. In other words, the pillar PL is connected to the source line SL at the outer peripheral surface at least at the depth position within the depth region A3. Further, the depth position of the bottom surface of the pillar PL is a position deeper than the depth position D2 described later.

The stacked body LM is covered with an insulating layer 52 such as a $SiO_2$ layer. The insulating layer 52 is covered with an insulating layer 53 such as a $SiO_2$ layer. The channel layer CN of the pillar PL is connected to an upper layer wiring such as a bit line via a plug CH penetrating the insulating layers 52 and 53. As a result, the memory cell MC is formed at each intersection of the pillar PL and the word line WL.

However, among the five pillars PL arranged between the two contacts LI, some pillars PL, for example, the central pillar PL, do not have the plug CH. Such pillars PL are arranged to maintain a regular arrangement of a plurality of the pillars PL. No memory cells are formed on the sides of the pillars PL or the functions of the memory cells on those sides are not effective. In addition, at the top of the central pillar PL, an insulating member (not illustrated) is formed so as to extend in the X direction and intersect the central pillar PL. Between the two contacts LI, a conductive layer (not illustrated) arranged above the word line WL of the uppermost layer of the stacked body LM is divided into two select gate lines that are adjacent in the Y direction. Note that the number of pillars PL arranged in the Y direction between the two contacts LI is not limited to five, and the number of pillars PL that can be arranged is arbitrary.

As described above, the pillars PL are arranged in a matrix, such that the memory cells MC are three-dimensionally arranged in the stacked body LM. By arranging the memory cells MC three-dimensionally, the memory unit MR is formed in the stacked body LM. Further, as a result, the semiconductor memory device 1 is configured as, for example, a three-dimensional nonvolatile memory.

Note that, the stacked body LM is provided with, for example, step portions (not illustrated) in which the word lines WL are terminated in a step shape at both ends in the X direction of the memory unit MR. As a result, the word line WL stacked in the stacked body LM can be drawn out and electrically connected to, for example, an upper layer wiring (not illustrated).

The stacked body LM is divided by the contacts LI as first structures extending in the X direction. The memory unit MR forms a region called a block between two contacts LI adjacent in the Y direction. Further, above the word line WL of the uppermost layer of the stacked body LM, strip-shaped insulating members extending in the X direction (not illustrated) are alternately arranged in the Y direction with the contacts LI, and as described above, the insulating members partition conductive layers above the uppermost word line WL into a pattern of select gate lines (not illustrated), for example.

The contact LI has an open end on the upper surface of the insulating layer 52, and includes a conductive layer 21, an insulating layer 54, and a block layer 55 as constituent materials, those are arranged in a slit having a closed end at a predetermined depth of the conductive layer DSC1. That is, the contact LI penetrates the insulating layer 52, the stacked body LM, the conductive layer DSC2, and the source line SL and reaches the predetermined depth of the conductive layer DSC1. Note that the block layer 55 may be removed from the slit in at least a part of the contact LI, and the insulating layer 54 may be disposed on the outermost peripheral side of the contact LI.

The contact LI has a width W1 as a first width at the bottom of the stacked body LM. Here, the contact LI may have a tapered shape in which the width in the Y direction becomes narrower toward the lower layer in the stacked body LM, or a bowing shape that swells in the middle of the stacked body LM. Therefore, the width W1 of the bottom of the stacked body LM can be the minimum width of the width of the contact LI in the stacked body LM in the Y direction.

The contact LI extends downward in the depth region A1 as the first depth region. The depth region A1 is a depth region in which the width of the contact LI in the Y direction is reduced from the depth position Ds on the upper surface of the conductive layer DSC2 to the depth position D1 as the first depth position, and the depth region A1 mainly corresponds to the depth position of the conductive layer DSC2. In the depth region A1, the contact LI has a predetermined width as the second width. Here, the contact LI may have a tapered shape that becomes narrower toward the bottom in the depth region A1. The second width includes a plurality of widths of the contact LI in the depth region A1. Specifically, the second width includes, for example, a width W2 near the upper surface of the conductive layer DSC2 that can be the maximum width of the contact LI in the depth region A1, and a width W3 near the lower surface of the conductive layer DSC2 that can be the minimum width of contact LI in depth region A1. The width of the contact LI in the depth region A1 including the widths W2 and W3 is narrower than the width W1 of the contact LI at the bottom of the stacked body LM. As a result, the conductive layer DSC2, that is, the upper layer side of the first conductive layer may project from the stacked body LM toward a central part of the contact LI in the width direction.

The contact LI reaches a depth region A2 as a second depth region which is a region deeper than the depth region A1. The depth region A2 is a depth region in which the width of the contact LI in the Y direction is expanded from the depth position D1 to the bottom of the contact LI via the depth position D2 as the second depth position. The region from the depth position D1 to the depth position D2 mainly correspond to the depth position of the source line SL. In the depth region A2, the contact LI has a predetermined width as a third width. Here, the contact LI has, for example, a substantially rectangular cross-sectional shape in the depth region A2. The contact LI may have a circular or elliptical cross-sectional shape in the depth region A2. The third width from the depth position D1 to the depth position D2 is a width that expands from the width W3 that can be the minimum width in the depth region A2 to a width W4 near the center in the depth direction of the depth region A2 that can be the maximum width in the depth region A2. The third width may be wider than the widths W2 and W3 of the contacts LI in the depth region A1 described above. In addition, after reaching the maximum width W4, for example, near the center in the depth direction of the depth region A2, the width of the contact LI is reduced again toward the bottom of the contact LI.

The insulating layer 54 forming the contact LI is arranged in the contact LI at the height position of the stacked body LM and the depth region A2. The insulating layer 54 is, for example, a $SiO_2$ layer or the like.

More specifically, the insulating layer 54 covers the sidewall of the contact LI that penetrates through the stacked body LM. Further, the insulating layer 54 penetrates into the stacked body LM at the height position of each word line WL, and accordingly, each word line WL recedes from the side surface of the contact LI into the stacked body LM. The block layer 55 is arranged between the insulating layer 54 and the insulating layer OL of the stacked body LM. That is, the block layer 55 is arranged on the upper and lower surfaces of the insulating layer 54 that have entered the height position of the word line WL, and the end surface of the insulating layer OL facing the side surface of the contact LI. However, at least a part of the block layer 55 on the end surface of the insulating layer OL may be removed as described above.

Further, the insulating layer 54 covers the side surface and the bottom surface of the contact LI in the depth region A2. The insulating layer 54 is interposed between the conductive layer 21 in the contact LI and the source line SL, and between the conductive layer 21 in the contact LI and the conductive layer DSC1 in the depth region A2. The block layer 55 is arranged between the insulating layer 54 and the source line SL, and between the insulating layer 54 and the conductive layer DSC1. Note that, the insulating layer 54 that covers the bottom surface of the contact LI may have a recess Nt.

The conductive layer 21 as a third conductive layer constituting the contact LI is arranged in the contact LI at the height position of the stacked body LM and the depth positions of the depth regions A1 and A2. The conductive layer 21 is, for example, a tungsten layer or the like.

More specifically, the conductive layer 21 is filled inside the insulating layer 54 that covers the sidewall of the contact LI that penetrates through the stacked body LM. Further, the conductive layer 21 is filled in the contact LI in the depth region A1. Further, the conductive layer 21 is filled inside the insulating layer 54 that covers the side surface and the bottom surface of the contact LI in the depth region A2.

Here, the conductive layer 21 is connected to the conductive layer DSC2 at the side surface in the width direction at least in the depth region A1. In addition, when the conductive layer DSC2 projects toward the central part of the contact LI in the width direction, the conductive layer 21 may be connected to the upper surface of the conductive layer DSC2 at the lower end of the conductive layer 21 located inside the stacked body LM.

The upper end of the conductive layer 21 arranged in this way is connected to the upper layer wiring or the like via a plug (not illustrated). As a result, the contact LI functions as a source line contact that electrically connects the conductive layer DSC2, the source line SL, and the conductive layer DSC1 functioning as a buried source line to the upper layer wiring.

Method of Manufacturing Semiconductor Memory Device

Next, a method of manufacturing the semiconductor memory device 1 according to the embodiment will be described with reference to FIGS. 2A to 8C. FIGS. 2A to 8C are cross-sectional views illustrating examples of a procedure of the method of manufacturing the semiconductor memory device 1 according to the embodiment.

Figure 2A:
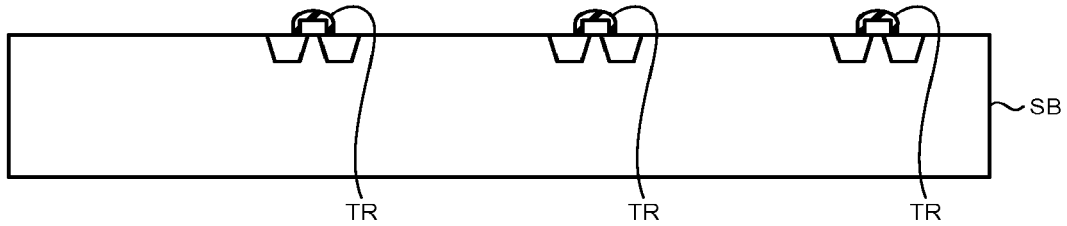
FIGS. 2A to 2C are cross-sectional views illustrating examples of a procedure of a manufacturing method of the semiconductor memory device according to the embodiment.

As illustrated in FIG. 2A, a transistor TR is formed on the surface of the substrate SB such as a silicon substrate.

Figure 2B:
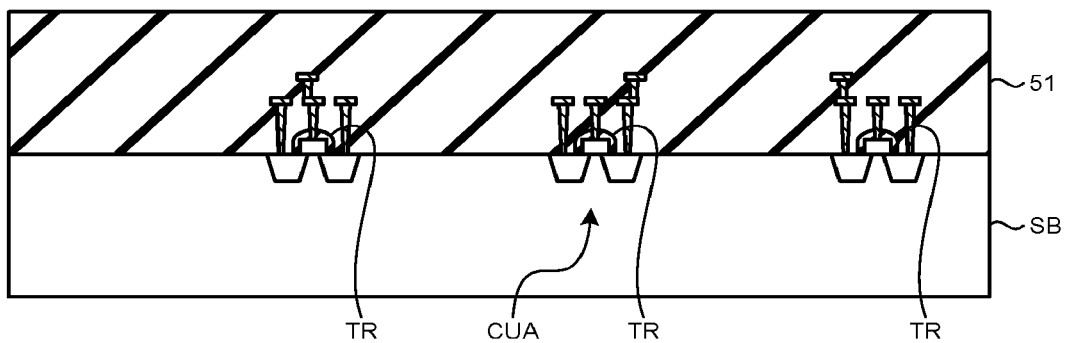

As illustrated in FIG. 2B, while the insulating layer 51 is being stacked on the transistor TR, contacts, wirings, and the like connected to the transistor TR are formed. As a result, the peripheral circuit CUA covered with the insulating layer 51 is formed.

Figure 2C:
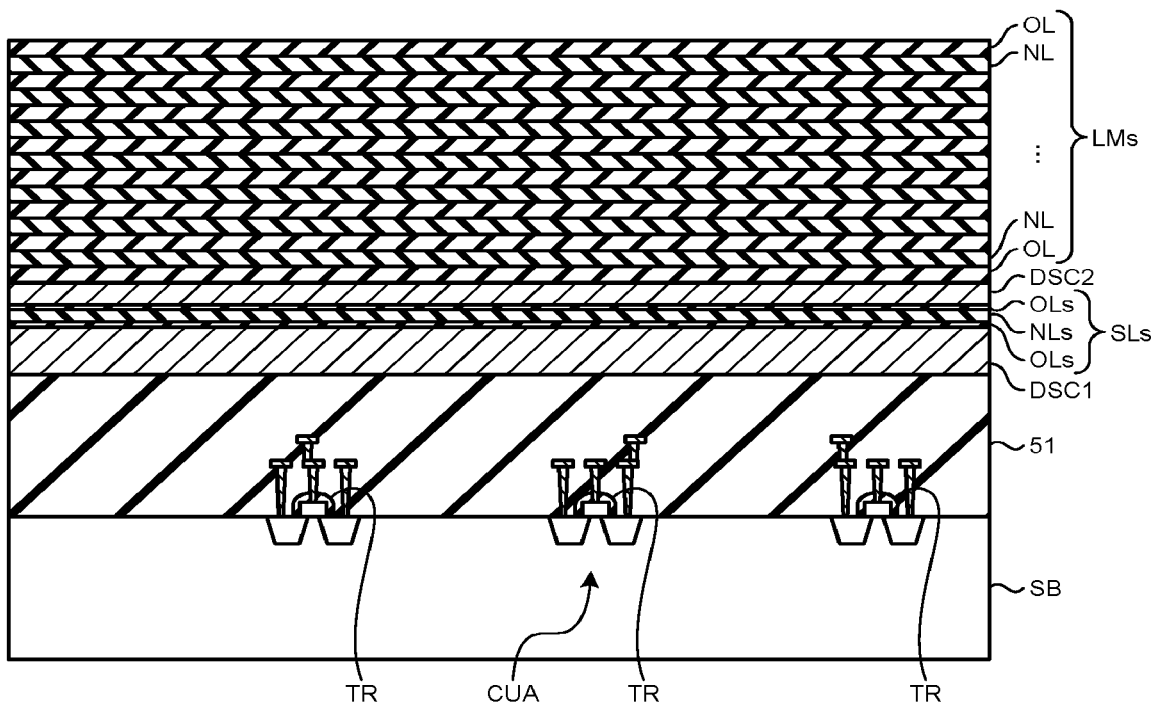

As illustrated in FIG. 2C, the conductive layer DSC1, a sacrificial layer SLs, and the conductive layer DSC2 are formed in this order on the insulating layer 51. The conductive layers DSC1 and DSC2 are polysilicon layers or the like as described above. The sacrificial layer SLs is a layer in which the insulating layer OLs, the sacrificial layer NLs, and the insulating layer OLs are stacked in this order. The sacrificial layer NLs is, for example, a SiN layer or the like, and is later replaced with a conductive layer such as a polysilicon layer to serve as the source line SL. At that time, the insulating layer OLs such as an $SiO_2$ layer adjacent to the sacrificial layer NLs in the upper and lower directions in the stacking direction also disappears and is replaced with the source line SL.

A stacked body LMs in which a plurality of the sacrificial layers NL and the insulating layers OL are alternately stacked is formed on the conductive layer DSC2. The sacrificial layer NL is, for example, a SiN layer or the like, and is later replaced with a conductive layer such as a tungsten layer to form the word line WL.

Note that, at this stage, an insulating member (not illustrated) extending in the X direction in the stacked body LMs and a step portion in which the sacrificial layer NL terminates in a step shape may be formed. The insulating member is formed, for example, by filling the inside of a groove formed so as to divide the stacked body LMs (the sacrificial layer and the insulating layer that are the upper layers of the stacked body) halfway with an insulating material. The step portion is formed by repeating etching of the sacrificial layer NL and the insulating OL while causing the end portion of a resist mask or the like covering the stacked body LMs to recede by slimming.

In the drawings thereafter, the lower layer structure of the substrate SB and the peripheral circuit CUA is omitted.

Figure 3A:
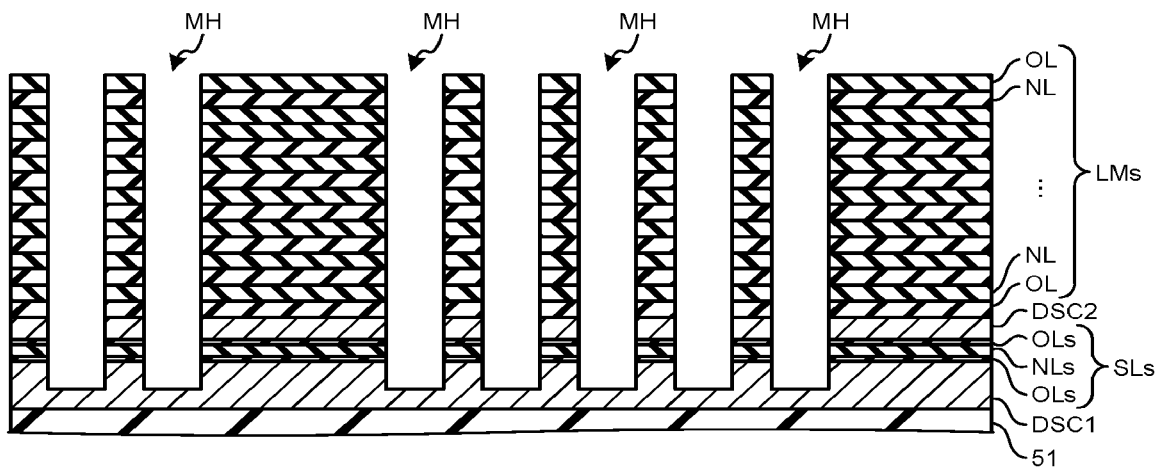
FIGS. 3A to 3C are cross-sectional views illustrating examples of a procedure of a manufacturing method of the semiconductor memory device according to the embodiment.

As illustrated in FIG. 3A, a plurality of memory holes MH having open ends on the upper surface of the stacked body LM and having closed ends at a predetermined depth of the conductive layer DSC1 are formed. That is, the memory hole MH penetrates the stacked body LMs, the conductive layer DSC2, and the sacrificial layer SLs, and reaches the predetermined depth of the conductive layer DSC1.

Figure 3B:
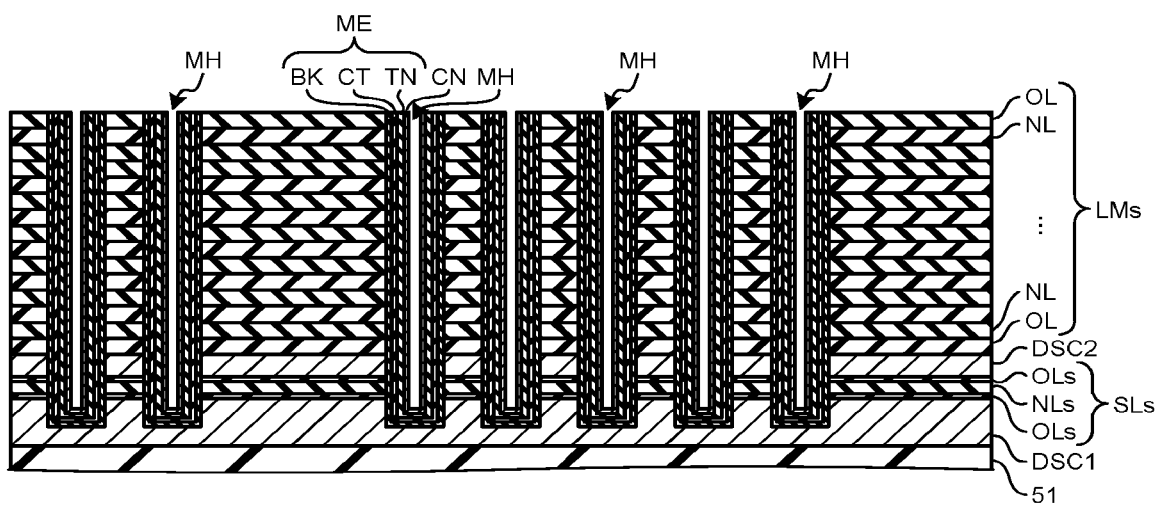

As illustrated in FIG. 3B, in the memory hole MH, in order from the outer peripheral side and the bottom side, a block insulating layer BK such as a $SiO_2$ layer, a charge storage layer CT such as a SiN layer, a tunnel insulating layer TN such as a $SiO_2$ layer, and a channel layer CN which is an amorphous silicon layer, a polysilicon layer, or the like are formed.

Figure 3C:
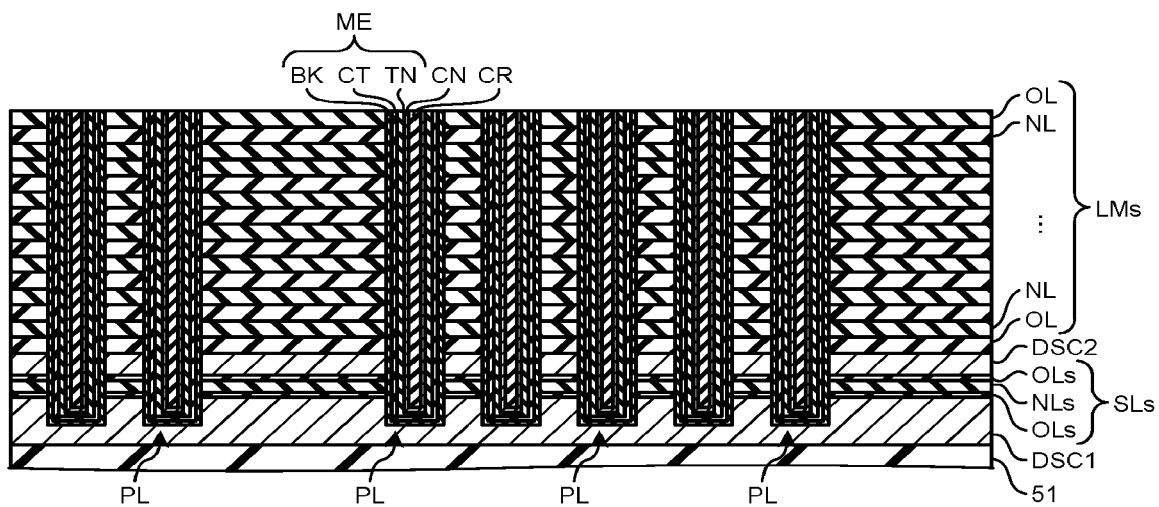

As illustrated in FIG. 3C, a core layer CR such as a $SiO_2$ layer is formed inside the channel layer CN of the memory hole MH. As a result, the pillar PL having the memory layer ME, the channel layer CN, and the core layer CR is formed.

Figure 4A:
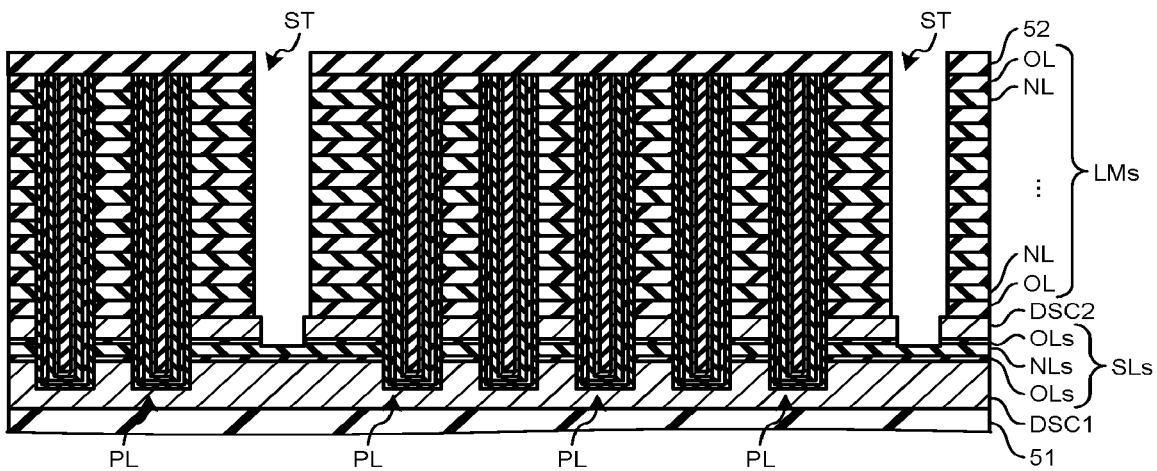
FIGS. 4A to 4C are cross-sectional views illustrating examples of a procedure of a manufacturing method of the semiconductor memory device according to the embodiment.

As illustrated in FIG. 4A, the insulating layer 52 is formed on the upper surface of the stacked body LM.

A slit ST having an open end on the upper surface of the insulating layer 52 and having a closed end at a predetermined depth of the sacrificial layer SLs is formed. That is, after forming a groove penetrating the insulating layer 52 and the stacked body LMs to reach the upper surface of the conductive layer DSC2, the conductive layer DSC2 and the insulating layer OLs of the sacrificial layer SLs are penetrated to form the slit ST reaching a predetermined depth of the sacrificial layer SLs.

Thus, the slit ST is formed by, for example, a two-step etching process. As a result, the width and taper angle of the slit ST in the stacked body LMs may be different from the width and taper angle in the conductive layer DSC2 and the sacrificial layer SLs. As an example, in the conductive layer DSC2 and the sacrificial layer SLs, the width of the slit ST becomes narrower, and it tends to be more tapered.

Figure 4B:
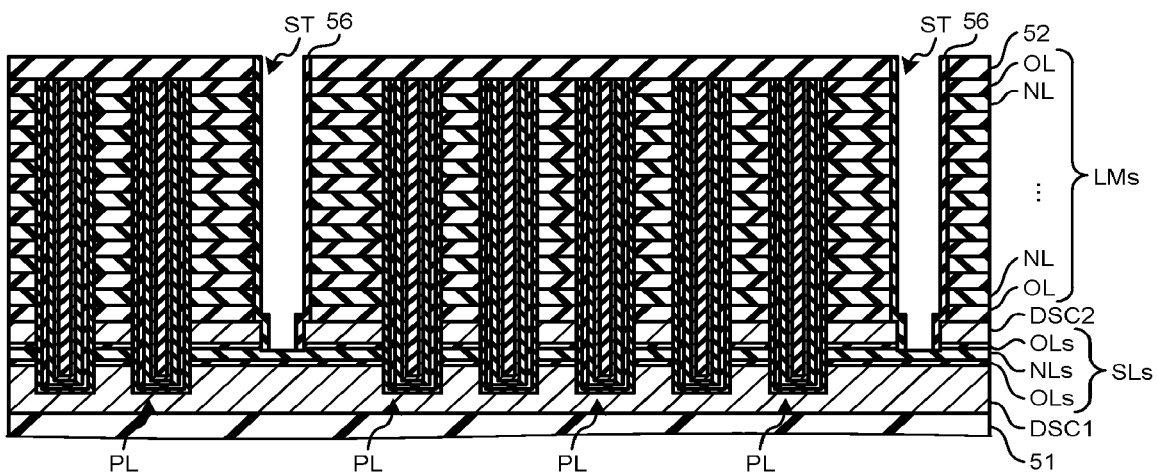

As illustrated in FIG. 4B, an insulating layer 56 such as a $SiO_2$ layer is formed on the sidewall of the slit ST extending from the insulating layer 52 to a predetermined depth of the sacrificial layer SLs.

Figure 4C:
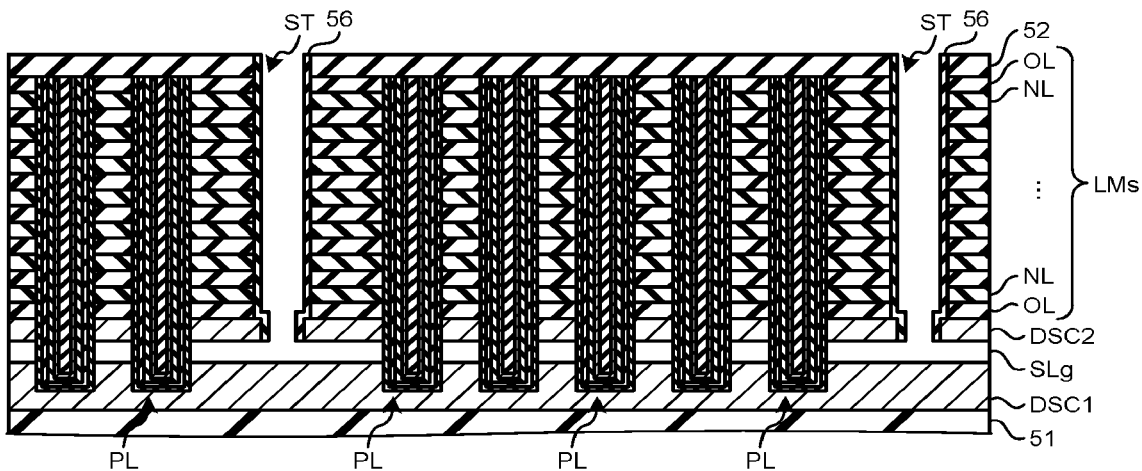

As illustrated in FIG. 4C, the sacrificial layer NLs sandwiched between the conductive layers DSC1 and DSC2 is removed via the slit ST. At this time, the insulating layers OLs arranged above and below the sacrificial layer NLs are also removed. As a result, a gap SLg is formed between the conductive layers DSC1 and DSC2. However, the sacrificial layer NL and the like in the stacked body LMs are not removed by being protected by the insulating layer 56 on the side wall of the slit ST.

Figure 5A:
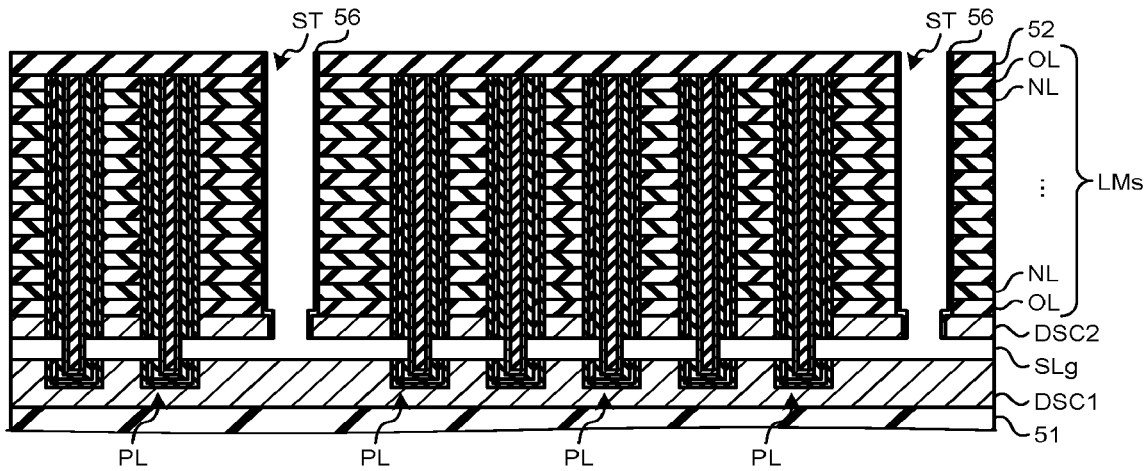
FIGS. 5A to 5C are cross-sectional views illustrating examples of a procedure of a manufacturing method of the semiconductor memory device according to the embodiment.

As illustrated in FIG. 5A, the memory layer ME on the outer peripheral surface of the pillar PL exposed in the gap SLg, that is, the block insulating layer BK, the charge storage layer CT, and the tunnel insulating layer TN, is removed via the slit ST and the gap SLg, and the channel layer CN is exposed in the gap SLg. At this time, although the insulating layer 56 itself becomes thin, the insulating layer OL and the like in the stacked body LMs are not removed by being protected by the remaining insulating layer 56.

Figure 5B:
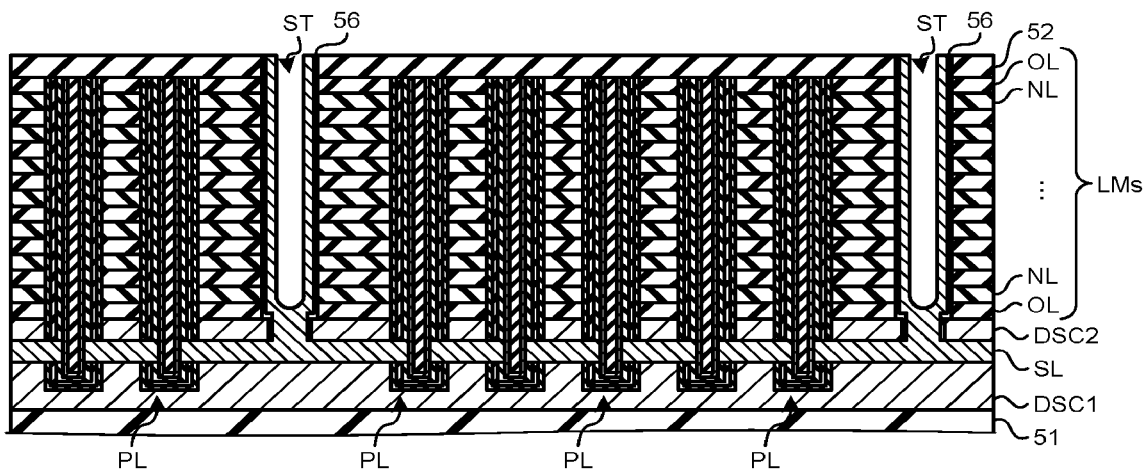

As illustrated in FIG. 5B, the source line SL sandwiched between the conductive layers DSC1 and DSC2 is formed by filling the gap SLg with a polysilicon layer or the like via the slit ST. At this time, a part or all of the inside of the slit ST is filled with a polysilicon layer or the like. By forming the source line SL, the channel layer CN of the pillar PL is connected to the source line SL at the side surface.

Note that the processing of FIGS. 4C, 5A, 5B, and the like is also referred to as source line SL replacement processing.

Figure 5C:
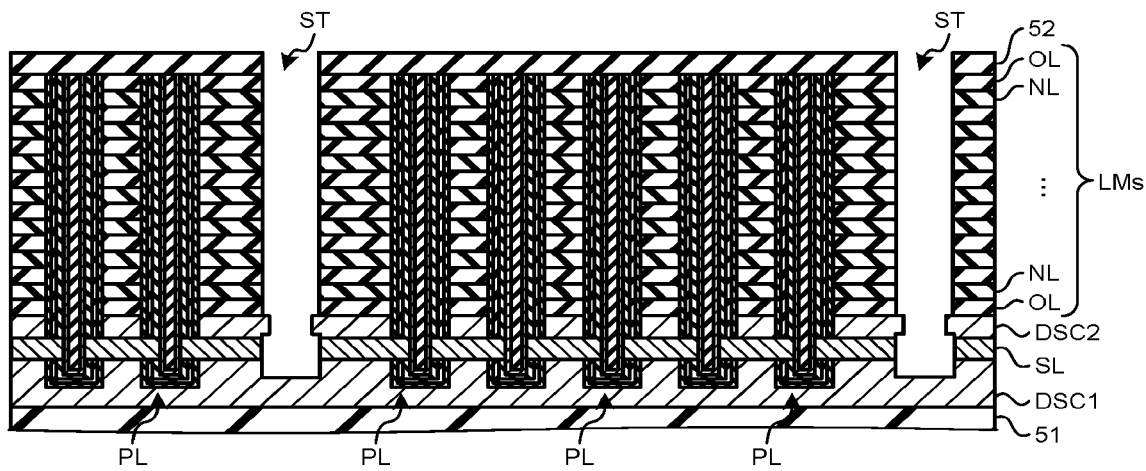

As illustrated in FIG. 5C, the polysilicon layer in the slit ST is removed, and the source line SL is penetrated such that the bottom surface of the slit ST reaches a predetermined depth in the conductive layer DSC1. At this time, the width of the slit ST in the source line SL and the conductive layer DSC1 is increased by performing, for example, an isotropic etching process. The conductive layer DSC2 protected by the insulating layer 56 is not widened. After that, the insulating layer 56 in the slit ST is removed.

Figure 6A:
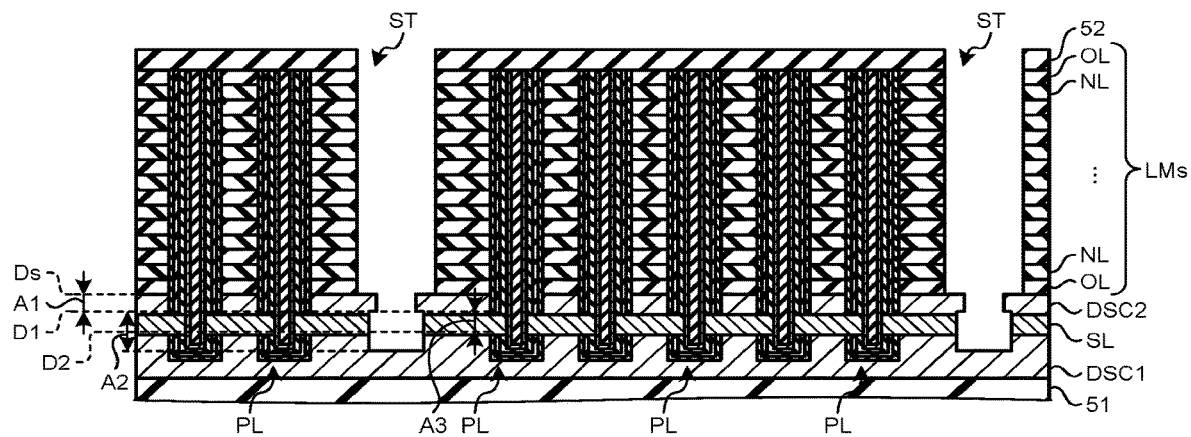
FIGS. 6A to 6C are cross-sectional views illustrating examples of a procedure of a manufacturing method of the semiconductor memory device according to the embodiment.

As illustrated in FIG. 6A, the ends of the sacrificial layer NL and the insulating layer OL of the stacked body LMs facing the slit ST are made to recede to increase the width of the slit ST in the stacked body LMs. As a result, the width is reduced in the depth region A1 described above with reference to the slit ST width in the stacked body LMs, and at least the slit ST width at the depth position D1 in the depth region A1 is formed with the slit ST whose width is enlarged in the depth region A2.

Further, since the sacrificial layer NL and the insulating layer OL that form the stacked body LMs, and the conductive layer DSC2 are made of different materials, it is possible to cause the stacked body LMs to recede without almost causing the conductive layer DSC2 to recede, that is, while keeping a selection ratio with the conductive layer DSC2. As a result, the upper surface and the side surface of the conductive layer DSC2 project toward a central part of the slit ST in the width direction, and a part of the upper surface of the conductive layer DSC2 is exposed at the bottom of the stacked body LMs. At this time, the projecting width of the conductive layer DSC2 is preferably equal to or larger than the thickness of the insulating layer 54 formed later in the slit ST, and more preferably, the projecting width of the conductive layer DSC2 is more than the thickness of the insulating layer 54.

Figure 6B:
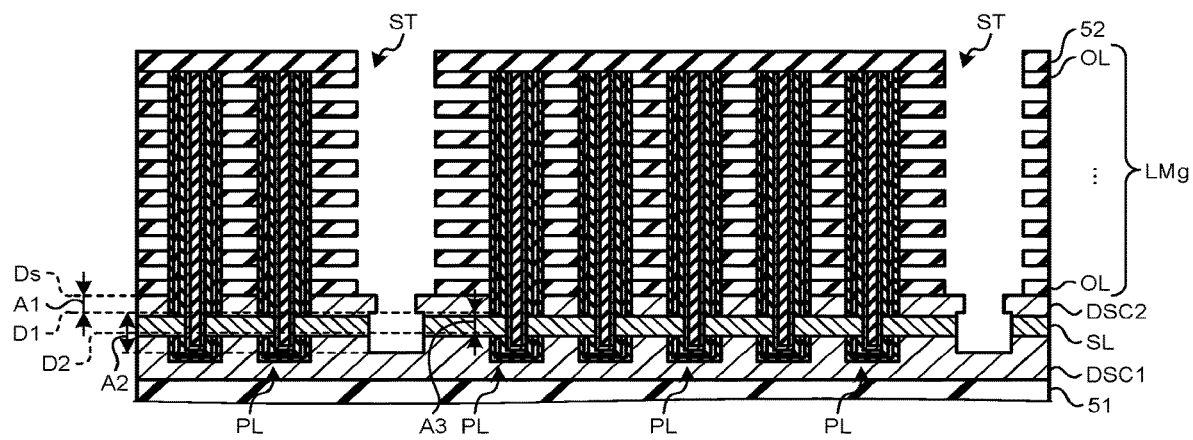

As illustrated in FIG. 6B, the sacrificial layer NL of the stacked body LMs is removed via the slit ST to form a stacked body LMg having a gap between the insulating layers OL.

Figure 6C:
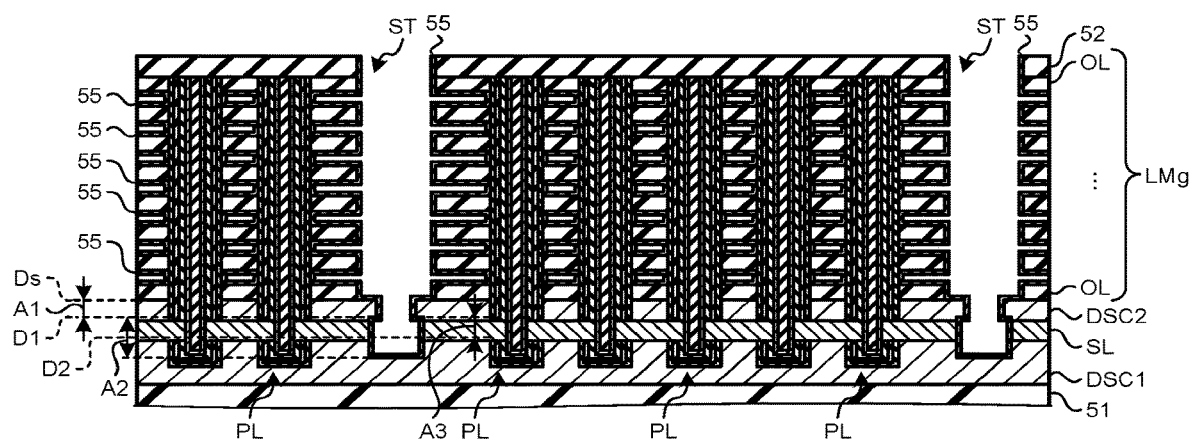

As illustrated in FIG. 6C, the block layer 55, which is an $Al_2O_3$ layer or the like, is formed via the slit ST on the exposed surface of the stacked body LMg and the exposed surface of the slit ST. That is, the block layer 55 is formed on the upper and lower surfaces of the exposed insulating layer OL of the stacked body LMg and on the end surface of the insulating layer OL facing the slit ST. Further, the block layer 55 is formed on the outer peripheral surface of the pillar PL exposed in the gap between the insulating layers OL of the stacked body LMg. Further, the block layer 55 is formed on the upper surface and side surface of the conductive layer DSC2 exposed in the slit ST, the side surface of the source line SL facing the slit ST, the side surface of the conductive layer DSC1, and the upper surface of the conductive layer DSC1 which is the bottom surface of the slit ST.

Figure 7A:
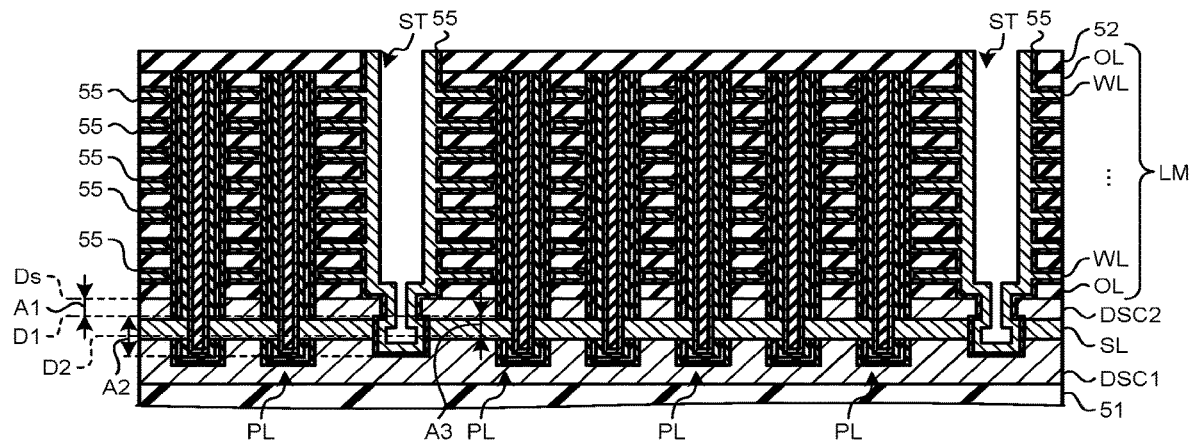
FIGS. 7A to 7C are cross-sectional views illustrating examples of a procedure of a manufacturing method of the semiconductor memory device according to the embodiment.

As illustrated in FIG. 7A, the gap between the insulating layers OL of the stacked body LMg is filled with a conductive layer such as a tungsten layer via the slit ST, and the word lines WL and insulating layers OL are alternately stacked to form the stacked body LM. At this time, a part or all of the inside of the slit ST is filled with a tungsten layer or the like.

Note that the processing of FIGS. 6B, 6C, 7A, and the like is also referred to as word line WL replacement processing.

Figure 7B:
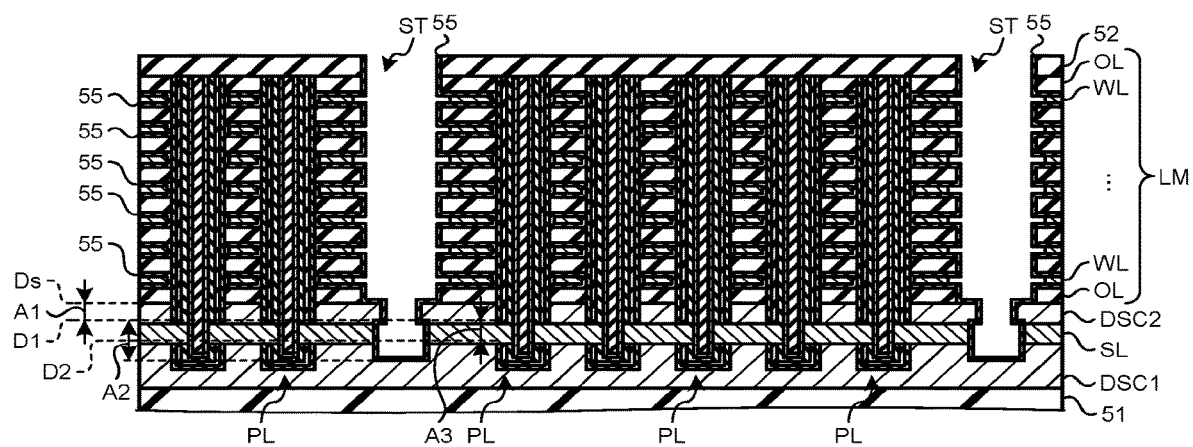

As illustrated in FIG. 7B, the tungsten layer and the like in the slit ST are removed. As a result, the end of the word line WL facing the slit ST is made to slightly recede into the stacked body LM. Note that when the tungsten layer or the like in the slit ST is removed, the block layer 55 formed on an exposed surface of each layer on the side surface and the bottom surface of the slit ST may be appropriately removed.

Figure 7C:
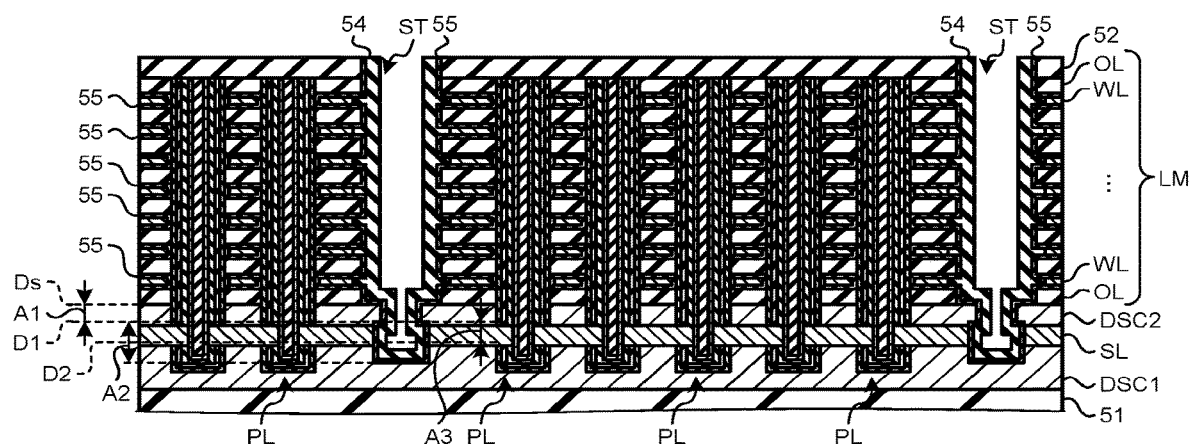

As illustrated in FIG. 7C, the insulating layer 54 is formed on the exposed surface in the slit ST. That is, the insulating layer 54 is formed via the block layer 55 on the end surface of the insulating layer OL facing the slit ST, the upper surface and side surface of the conductive layer DSC2 facing the slit ST, the side surface of the source line SL facing the slit ST, the side surface of the conductive layer DSC1, and the upper surface of the conductive layer DSC1, which is the bottom surface of the slit ST. Further, the insulating layer 54 is formed so as to extend to the end surface of the word line WL receding from the side surface of the slit ST. As a result, the gap between the insulating layers OL caused by the receding of the word line WL is filled with the insulating layer 54 via the block layer 55.

Figure 8A:
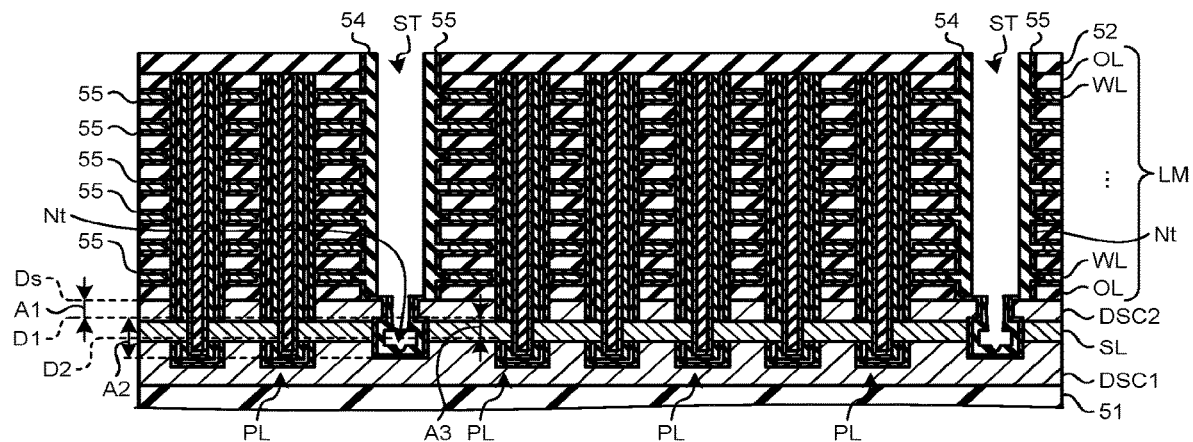
FIGS. 8A to 8C are cross-sectional views illustrating examples of a procedure of a manufacturing method of the semiconductor memory device according to the embodiment.

As illustrated in FIG. 8A, the insulating layer 54 is removed by anisotropic etching using a method such as reactive ion etching (RIE) with the insulating layer 54 below the stacked body LM as a target.

As a result, at least a part of the insulating layer 54 on the upper surface and the side surface of the conductive layer DSC2 facing the slit ST is removed. At this time, as described above, since the projecting width of the conductive layer DSC2 into the slit ST is, for example, equal to or greater than the thickness of the insulating layer 54, the insulating layer 54 on the side surface of the conductive layer DSC2 is likely to be completely or almost completely removed.

Further, although ions in plasma can reach the bottom surface of the slit ST, the slit ST width in the depth position of the conductive layer DSC2, that is, the slit ST width in the depth region A1 is narrower than the width of the stacked body LM and the depth region A2, and the entire surface of the insulating layer 54 on the bottom surface of the slit ST cannot be etched, and therefore, for example, the recess Nt is formed in the insulating layer 54 near the center position of the bottom surface.

Figure 8B:
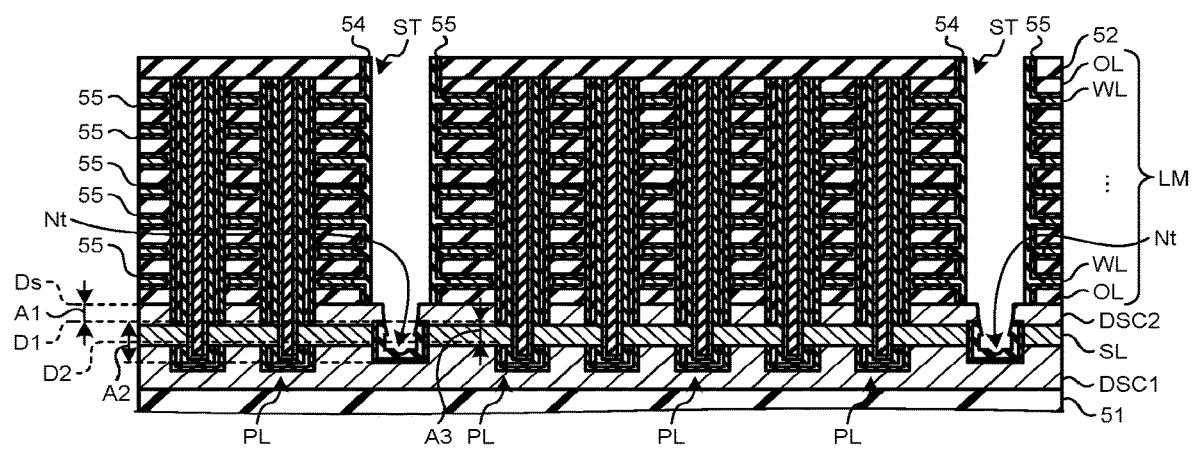

As illustrated in FIG. 8B, the block layer 55 is removed by anisotropic etching using a method such as RIE with the block layer 55 below the stacked body LM as a target. As a result, at least a part of the block layer 55 on the upper surface and the side surface of the conductive layer DSC2 facing the slit ST is removed. At this time, the insulating layer 54 left on the upper surface and the side surface of the conductive layer DSC2 facing the slit ST, and a part of the insulating layer 54 on the bottom surface of the slit ST may be removed.

By the processing illustrated in FIGS. 8A and 8B, the insulating layer 54 and the block layer 55 on the upper surface and the side surface of the conductive layer DSC2 facing the slit ST are removed.

Figure 8C:
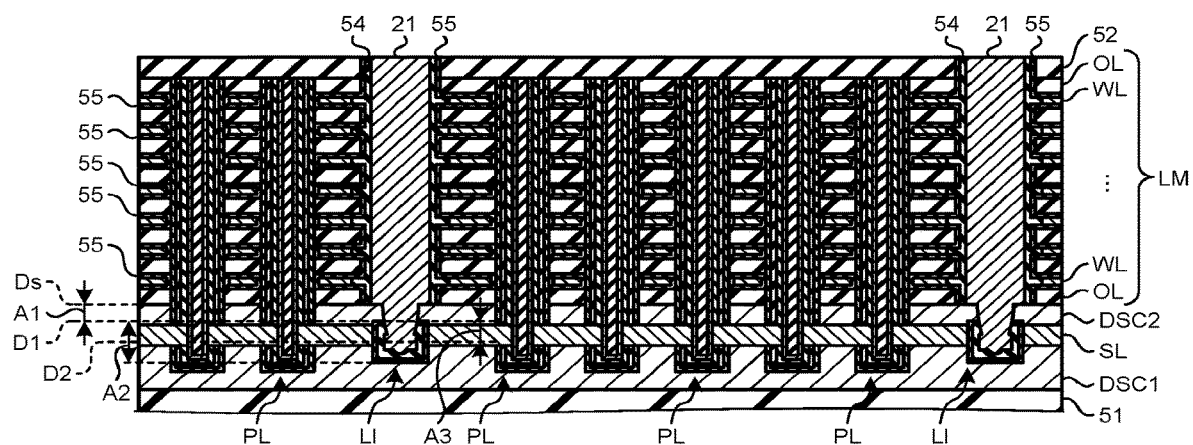

As illustrated in FIG. 8C, the conductive layer 21 is filled in the slit ST to form the contact LI. The conductive layer 21 is prevented from being electrically connected to the word line WL by the insulating layer 54 and the block layer 55 at the height position of the stacked body LM. On the other hand, since the insulating layer 54 and the block layer 55 are removed from the side surface of the conductive layer DSC2 facing the slit ST, the conductive layer 21 is connected to the conductive layer DSC2 at least on the side surface in the width direction. The upper surface of the conductive layer DSC2 from which the insulating layer 54 and the block layer 55 have been removed may be connected to the conductive layer 21.

After that, the insulating layer 53 is formed on the insulating layer 52, and the plug CH penetrating the insulating layers 52 and 53 and connected to the channel layer CN of the pillar PL is formed. In addition, a plug (not illustrated) is formed to connect the upper end of the conductive layer 21 of the contact LI to the upper wiring or the like.

As described above, the semiconductor memory device 1 of the embodiment is manufactured.

Note that, in view of the method for manufacturing the semiconductor memory device 1 described above, the contact LI of the semiconductor memory device 1 may have a shape different from the above-described shape illustrated in FIG. 1 and the like. Some of such examples will be described with reference to FIGS. 9 and 10.

Figure 9:
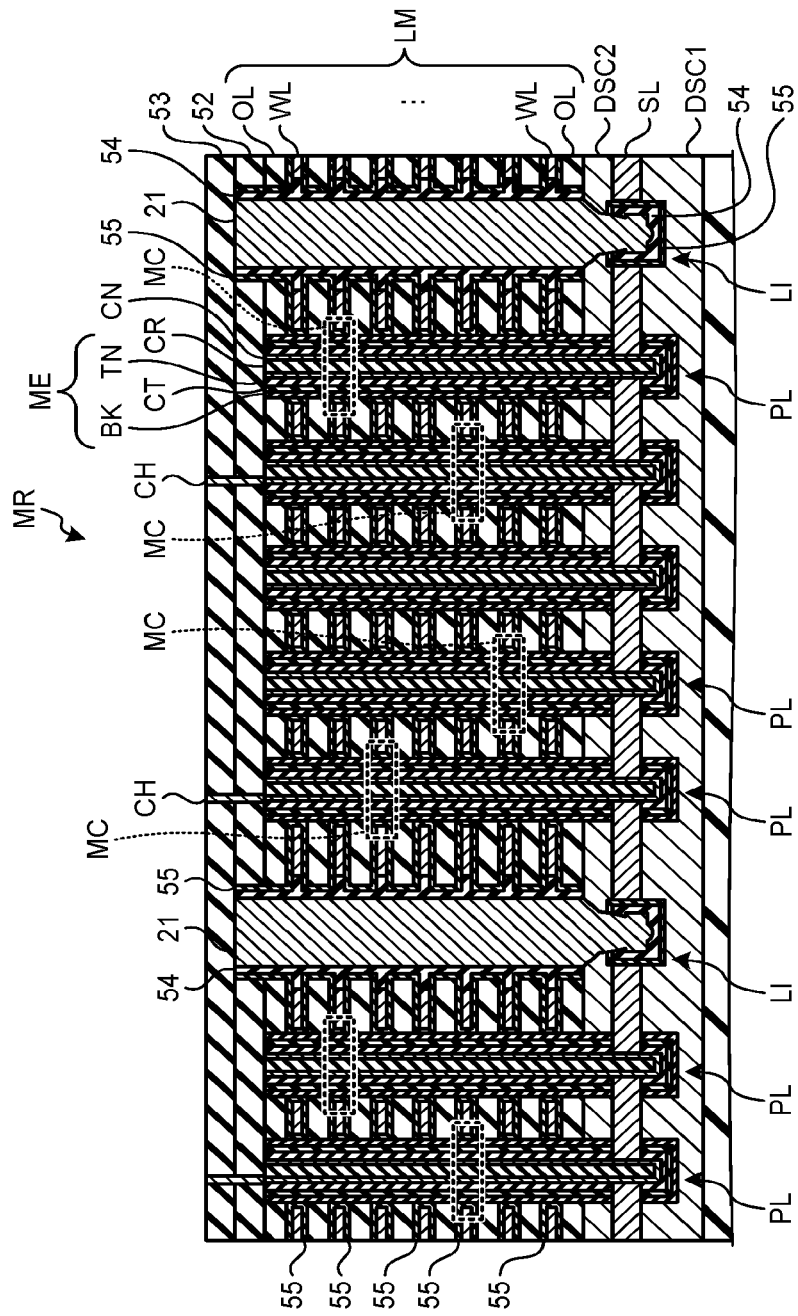
FIG. 9 is a cross-sectional view illustrating an example in which contacts of the semiconductor memory device according to the embodiment have different shapes.
Figure 10:
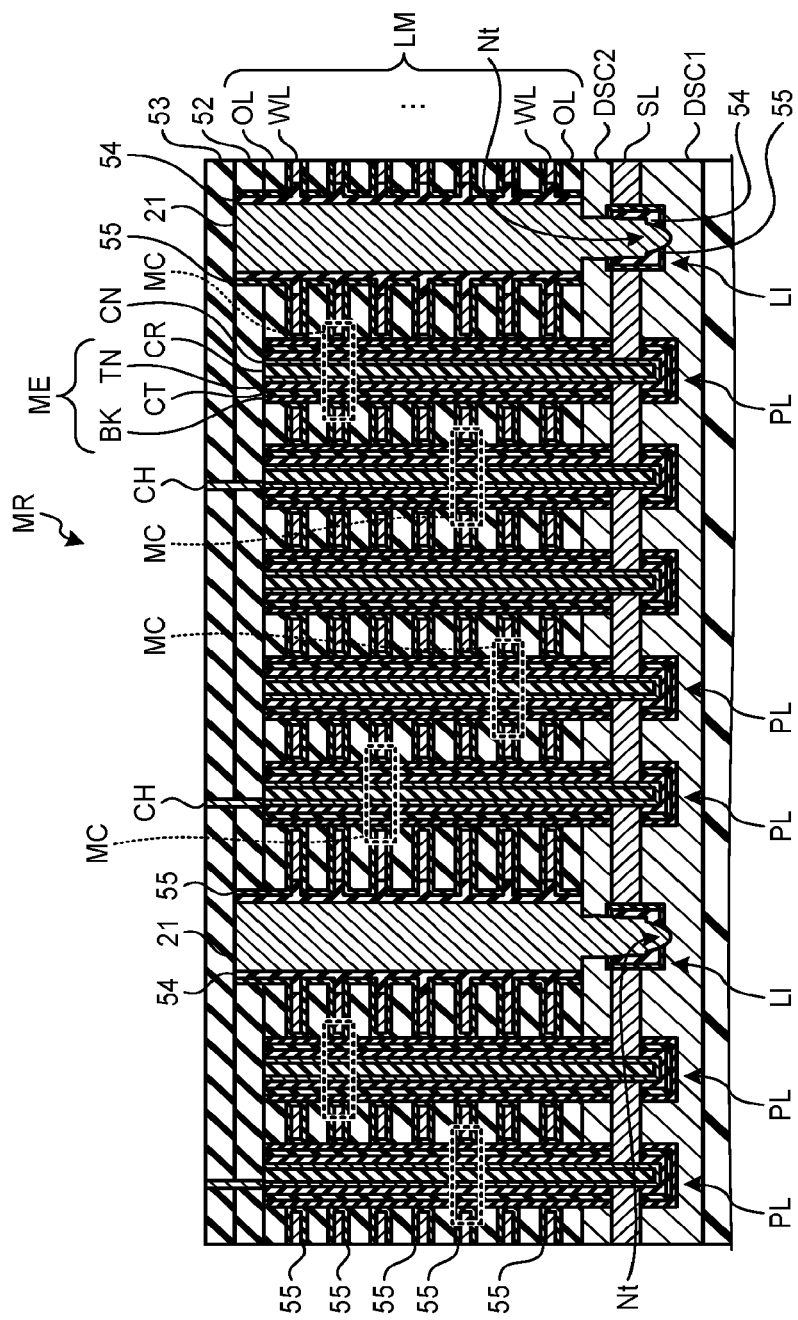
FIG. 10 is a cross-sectional view illustrating an example in which contacts of the semiconductor memory device according to the embodiment have different shapes.

FIGS. 9 and 10 are cross-sectional views illustrating examples in which the contacts LI of the semiconductor memory device 1 according to the embodiment have different shapes.

In the processing of FIGS. 8A and 8B described above, the upper surface of the conductive layer DSC2 exposed at the bottom of the stacked body LM in the slit ST is one of the portions that are subjected to relatively strong ion bombardment. For this reason, in at least one of the etching processing of the insulating layer 54 in FIG. 8A and the etching processing of the block layer 55 in FIG. 8B, the upper surface of the conductive layer DSC2 may be etched.

As illustrated in FIG. 9, in the above case, in the contact LI included in the semiconductor memory device 1, the upper surface of the conductive layer DSC2 may have a shape inclined downward toward the central part of the contact LI in the width direction. In this case also, the conductive layer 21 of the contact LI can be connected to the conductive layer DSC2 on the side surface in the width direction.

Further, FIGS. 8A and 8B described above, the vicinity of the center of the bottom surface of the slit ST may be impacted by ions passing through the slit ST penetrating the conductive layer DSC2 although the width is narrow. Therefore, in at least one of the etching process of the insulating layer 54 in FIG. 8A and the etching process of the block layer 55 in FIG. 8B, the recess Nt may penetrate the insulating layer 54 and the block layer 55 in the thickness direction and reach the conductive layer DSC1.

As illustrated in FIG. 10, in the above case, in the contact LI included in the semiconductor memory device 1, the conductive layer 21 can be connected to the conductive layer DSC1 even at the lower end via the recess Nt reaching the conductive layer DSC1.

A semiconductor memory device such as a three-dimensional nonvolatile memory may have the configuration that the layer serving as the source line arranged below the pillar is penetrated by the pillar exposing the channel layer to establish conduction between the channel layer and the source line. In this case, in order to expose the channel layer at the penetrating portion of the layer serving as the source line, for example, the source line replacement processing is performed to remove the memory layer on the side wall of the pillar exposed in the gap before the source line is filled.

The source line replacement processing is performed, for example, through a slit that penetrates the stacked body, and thus the slit is also penetrated to the depth that reaches the layer serving as the source line. When a source line forming material deposited in the slit is removed during the source line replacement processing, the slit reaches a deeper position. After that, in order to make the slit function as a source line contact, an insulating layer serving as a liner is formed in the slit, and then the conductive layer is filled. At this time, the insulating layer on the bottom surface of the slit is removed such that the conductive layer filled in the slit and the source line can be electrically connected.

However, it may be difficult to reliably remove the insulating layer on the bottom surface of the slit of a deep groove. When the slit has a tapered shape, the width of the slit becomes narrower toward the bottom surface of the slit. This makes it even more difficult to remove the insulating layer on the bottom surface, and further, in some cases, the opening of the insulating layer, that is, the area where the filled conductive layer can be brought into conduction with the source line afterwards, may be small.

According to the semiconductor memory device 1 of the embodiment, the conductive layer 21 of the contact LI is connected to the conductive layer DSC2 on the side surface in the width direction in the depth region A1.

Accordingly, for example, even if the conductive layer 21 and the conductive layer DSC1 are not electrically connected on the bottom surface of the contact LI, the conductive layer 21 and the source line SL can be electrically connected via the conductive layer DSC2.

Further, the insulating layer 54 in the depth region A1 is located at a shallower position than the insulating layer 54 on the bottom surface of the contact LI, and is easily removed. Therefore, the conductive layer DSC2 can be exposed more reliably.

As described above, the source line SL and the contact LI can be connected more reliably.

According to the semiconductor memory device 1 of the embodiment, the contact LI has a width wider than the depth region A1 at the bottom of the stacked body LM.

By processing the contact LI into such a shape, in the manufacturing process of the semiconductor memory device 1, during the etching process targeting the insulating layer 54 and the block layer 55 below the stacked body LM, the aspect ratio of the slit ST can be reduced to facilitate removal of the insulating layer 54 and the block layer 55 below.

In addition, the side wall of the slit ST in the stacked body LMs recedes so that the side surface of the conductive layer DSC2 protrudes toward the central part of the slit ST in the width direction, and the insulating layer 54 and the block layer 55 on the side surface of the conductive layer DSC2 are more easily removed.

Further, since the slit ST of the stacked body LMs portion is widened after forming the slit ST with a predetermined width, an increase in the size of the semiconductor memory device 1 can be suppressed as compared with the case where the slit width is widened from the beginning.

Note that, in the above-described embodiment, the semiconductor memory device 1 has the peripheral circuit CUA below the memory unit MR. However, the peripheral circuit may be arranged above the memory unit by bonding the stacked body including the memory unit, the source line, and the like to the substrate on which the peripheral circuit is arranged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first conductive layer;
   a stacked body that is arranged above the first conductive layer and includes a plurality of second conductive layers stacked with a first insulating layer interposed therebetween;
   a pillar that extends in the stacked body in a stacking direction of the stacked body, reaches a first position in the first conductive layer, the first position being deeper than a position of an upper surface of the first conductive layer, and includes a plurality of memory cells at intersections with at least some of the plurality of second conductive layers; and
   a first structure that extends in the stacked body in a first direction orthogonal to the stacking direction and in the stacking direction, and reaches a second position in the first conductive layer, the second position being deeper than the position of the upper surface of the first conductive layer, wherein
   the first structure has a width in a second direction orthogonal to the stacking direction and the first direction, the width including a first width at a bottom of the stacked body and a second width that is narrower than the first width, in a first depth region from the position of the upper surface of the first conductive layer to a first depth position that is deeper than the position of the upper surface in the first conductive layer, and
   the first structure includes a third conductive layer that extends in the first structure in the first direction and the stacking direction and is connected to a side surface of the first conductive layer in the second direction in the first depth region.

2. The semiconductor memory device according to claim 1, wherein the second width of the first structure decreases from upper to lower in the first depth region.

3. The semiconductor memory device according to claim 1, wherein
   the first conductive layer projects than the stacked body toward a central part of the first structure in the second direction in the first depth region, and
   the third conductive layer is also connected to the projecting upper surface of the first conductive layer.

4. The semiconductor memory device according to claim 3, wherein the projecting upper surface of the first conductive layer is inclined in such a direction that a depth increases toward the central part of the first structure in the second direction.

5. The semiconductor memory device according to claim 1, wherein the first structure further includes a second insulating layer interposed between the first conductive layer and the third conductive layer in a second depth region deeper than the first depth region while covering a bottom of the first structure.

6. The semiconductor memory device according to claim 5, wherein
   the second insulating layer covering the bottom of the first structure has a recess, and
   the third conductive layer projects into the recess.

7. The semiconductor memory device according to claim 1, wherein the third conductive layer is connected to the first conductive layer also at a bottom of the first structure.

8. The semiconductor memory device according to claim 1, wherein the pillar includes a semiconductor layer that extends in the stacking direction in the stacked body and is connected to the first conductive layer at a third depth region deeper than the first depth region in the first conductive layer.

9. The semiconductor memory device according to claim 8, wherein the first conductive layer is connected to an outer peripheral surface of the semiconductor layer in the third depth region.

10. The semiconductor memory device according to claim 1, further comprising a peripheral circuit that includes a transistor disposed below the first conductive layer and contributes to an operation of the memory cells.

11. A semiconductor memory device comprising:
a first conductive layer;
a stacked body that is arranged above the first conductive layer and includes a plurality of second conductive layers stacked with a first insulating layer interposed therebetween;
a pillar that extends in the stacked body in a stacking direction of the stacked body, reaches a first position in the first conductive layer, the first position being deeper than a position of an upper surface of the first conductive layer, and includes a plurality of memory cells at intersections with at least some of the plurality of second conductive layers; and
a first structure that extends in the stacked body in a first direction orthogonal to the stacking direction and in the stacking direction, and reaches a second position in the first conductive layer, the second position being deeper than the position of the upper surface of the first conductive layer, wherein
the first structure includes:
a third conductive layer that extends in the first structure in the first direction and the stacking direction and is connected to a side surface of the first conductive layer in a first depth region in a second direction orthogonal to the stacking direction and the first direction; and
a second insulating layer interposed between the first conductive layer and the third conductive layer in a second depth region deeper than the first depth region while covering a bottom of the first structure.

12. The semiconductor memory device according to claim 11, wherein the first structure has a width in the second direction, the width including a first width at a bottom of the stacked body, a second width in the first depth region, and a third width in the second depth region, respectively, the second width being narrower than the first width, the second width being narrower than the third width at a depth position of a boundary between the first depth region and the second depth region.

13. The semiconductor memory device according to claim 12, wherein the second width of the first structure decreases from upper to lower in the first depth region.

14. The semiconductor memory device according to claim 12, wherein
the first conductive layer projects than the stacked body toward a central part of the first structure in the second direction in the first depth region, and
the third conductive layer is also connected to the projecting upper surface of the first conductive layer.

15. The semiconductor memory device according to claim 14, wherein the projecting upper surface of the first conductive layer is inclined in such a direction that a depth increases toward the central part of the first structure in the second direction.

16. The semiconductor memory device according to claim 11, wherein
the second insulating layer covering the bottom of the first structure has a recess, and
the third conductive layer projects into the recess.

17. The semiconductor memory device according to claim 16, wherein
the recess penetrates the second insulating layer, and
the third conductive layer projecting into the recess is also connected to the first conductive layer at the bottom of the first structure.

18. The semiconductor memory device according to claim 11, wherein the pillar includes a semiconductor layer that extends in the stacking direction in the stacked body and is connected to the first conductive layer at a third depth region deeper than the first depth region in the first conductive layer.

19. The semiconductor memory device according to claim 18, wherein the first conductive layer is connected to an outer peripheral surface of the semiconductor layer in the third depth region.

20. The semiconductor memory device according to claim 11, further comprising a peripheral circuit that includes a transistor disposed below the first conductive layer and contributes to an operation of the memory cell.

* * * * *